US010756124B2

(12) United States Patent
Song et al.

(10) Patent No.: US 10,756,124 B2
(45) Date of Patent: Aug. 25, 2020

(54) ARRAY SUBSTRATE, MANUFACTURING METHOD THEREOF AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Xingxing Song, Beijing (CN); Zhenfei Cai, Beijing (CN); Dayong Yu, Beijing (CN); Kun Yu, Beijing (CN); Zhongzhen Li, Beijing (CN); Wenjie Wang, Beijing (CN)

(73) Assignees: Hefei Xinsheng Optoelectronics Technology Co., Ltd., Hefei, Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/407,507

(22) Filed: May 9, 2019

(65) Prior Publication Data
US 2020/0075640 A1 Mar. 5, 2020

(30) Foreign Application Priority Data

Aug. 29, 2018 (CN) .......................... 2018 1 0997079

(51) Int. Cl.
*H01L 27/12* (2006.01)
*H01L 27/32* (2006.01)
(Continued)

(52) U.S. Cl.
CPC ...... *H01L 27/1244* (2013.01); *H01L 27/0203* (2013.01); *H01L 27/124* (2013.01);
(Continued)

(58) Field of Classification Search
CPC .......................... H01L 27/07; H01L 27/281
See application file for complete search history.

(56) References Cited

U.S. PATENT DOCUMENTS 7,271,786 B2 9/2007 Kang
9,665,221 B2 5/2017 Han et al.
(Continued)

FOREIGN PATENT DOCUMENTS

CN 104750330 A 7/2015
CN 105204250 A 12/2015
(Continued)

OTHER PUBLICATIONS

Mar. 3, 2020—(CN) the First Office Action Appn 201810997079.8 with English Translation.

*Primary Examiner* — Cheung Lee
(74) *Attorney, Agent, or Firm* — Banner & Witcoff, Ltd.

(57) ABSTRACT

An array substrate, manufacturing method thereof, and display device are disclosed. The array substrate includes signal lines; IC connection lines; the IC connection lines include at least two IC connection line groups, the at least two IC connection line groups comprise a first IC connection line group and a second IC connection line group, the array substrate further includes a lead, an orthographic projection of the lead on a straight line in a second direction is overlapped or connected with an orthographic projection of a first IC connection line in the first IC connection line group which is closest to the second IC connection line group on the straight line in a second direction and an orthographic projection of the second IC connection line in the second IC connection line group which is closest to the first IC connection line group on the straight line in a second direction respectively.

18 Claims, 5 Drawing Sheets

(51) Int. Cl.
*H01L 27/28* (2006.01)
*H01L 27/02* (2006.01)
(52) U.S. Cl.
CPC ........ *H01L 27/1288* (2013.01); *H01L 27/285* (2013.01); *H01L 27/3276* (2013.01)

(56) References Cited

U.S. PATENT DOCUMENTS

2016/0291753 A1 10/2016 Cao et al.
2017/0139296 A1* 5/2017 Kimoto .................... G09F 9/00

FOREIGN PATENT DOCUMENTS

CN 104698666 B 4/2018
KR 1020160042351 A 4/2016

* cited by examiner

ARRAY SUBSTRATE, MANUFACTURING METHOD THEREOF AND DISPLAY DEVICE

CROSS REFERENCE TO RELATED APPLICATIONS

The present application claims priority of Chinese Patent Application No. 201810997079.8 filed on Aug. 29, 2018, the disclosure of which is incorporated herein by reference in its entirety as part of the present application.

TECHNICAL FIELD

The embodiments of the present disclosure relate to an array substrate, a manufacturing method thereof and a display device.

BACKGROUND

With the continuous development of science and technology, various electronic products with display function have entered people's daily life. At present, these electronic products usually adopt a liquid crystal display device (LCD) or an organic light emitting diode display device (OLED).

Organic light emitting diode (OLED) display has become the focus of current research and market due to its advantages of self-luminescence, high contrast, thin thickness, viewing angle light, fast response speed, bendability and wide application temperature range.

SUMMARY

At least one embodiment of the present disclosure provides an array substrate including: a base substrate; a plurality of signal lines and a plurality of IC connection lines which are arranged in one-to-one correspondence with the plurality of signal lines, each of the plurality of signal lines extends in a first direction, the plurality of IC connection lines including at least two IC connection line groups arranged in a second direction perpendicular to the first direction, configured to connect the plurality of signal lines to at least two driving ICs, the at least two IC connection line groups includes a first IC connection line group and a second IC connection line group which are adjacent to each other, the array substrate further includes a lead, and an orthographic projection of the lead on a straight line in the second direction is overlapped or connected with an orthographic projection of a first IC connection line in the first IC connection line group which is closest to the second IC connection line group on the straight line in the second direction and an orthographic projection of a second IC connection line in the second IC connection line group which is closest to the first IC connection line group on the straight line in the second direction, respectively.

For example, in the array substrate provided by an embodiment of the present disclosure, the lead is connected with the second IC connection line, and an arrangement order of the signal line corresponding to the first IC connection line and the signal line corresponding to the second IC connection line in the second direction is opposite to an arrangement order of the first IC connection line group and the second IC connection line group in the second direction.

For example, in the array substrate provided by an embodiment of the present disclosure, the lead is electrically connected with the signal line corresponding to the second IC connection line through a bridge structure.

For example, in the array substrate provided by an embodiment of the present disclosure, the lead is arranged in parallel with the first IC connection line and located on a side of the first IC connection line away from the plurality of signal lines.

For example, in the array substrate provided by an embodiment of the present disclosure, the lead is insulated from the plurality of signal lines and the plurality of IC connection lines.

For example, in the array substrate provided by an embodiment of the present disclosure, the lead includes a first portion parallel to the first IC connection line and a second portion parallel to the second IC connection line.

For example, the array substrate provided by an embodiment of the present disclosure further includes a display area and a peripheral area surrounding the display area; and a dummy area located on a side of the peripheral area away from the display area, the plurality of signal lines located in the display area and the peripheral area, the plurality of IC connection lines located in the peripheral area, the dummy area is provided with a mesh structure including transverse grid lines extending in the first direction and longitudinal grid lines extending in the second direction to form a plurality of openings arranged in an array, and a size of the openings crossed by an extension line of the signal line corresponding to the first IC connection line in the second direction is larger than a size of a gap between adjacent ones of the plurality of signal lines in the second direction.

For example, in the array substrate provided by an embodiment of the present disclosure, the size of the openings crossed by the extension line of the signal line corresponding to the first IC connection line in the second direction is greater than twice of the size of a gap between adjacent ones of the plurality of signal lines in the second direction.

For example, in the array substrate provided by an embodiment of the present disclosure, the plurality of signal lines include gate lines, and the at least two IC connection line groups are configured to connect the gate lines to at least two gate driving ICs.

For example, the array substrate provided by an embodiment of the present disclosure further includes an anode located on a side of the gate line away from the base substrate; and an organic light emitting layer located on a side of the anode away from the base substrate and electrically connected with the anode.

For example, in the array substrate provided by an embodiment of the present disclosure, the plurality of signal lines are insulated from each other.

At least an embodiment of the present disclosure provides a display device including the array substrate according to any one of the above.

At least an embodiment of the present disclosure provides a manufacturing method of an array substrate, which includes: forming a conductive layer on a base substrate; forming a photoresist pattern on a side of the conductive layer away from the base substrate; and performing an etching process by taking the photoresist pattern as a mask to form a plurality of signal lines and a plurality of IC connection lines on the base substrate, each of the plurality of signal lines extends in a first direction; the plurality of IC connection lines are arranged in one-to-one correspondence with the plurality of signal lines, the plurality of IC connection lines include at least two IC connection line groups arranged along a second direction perpendicular to the first direction, are configured to connect the plurality of signal lines to at least two driving ICs, the at least two IC connection line groups include a first IC connection line group and a second IC connection line group which are adjacent to each other, the array substrate further includes a lead, an orthographic projection of the lead on a straight line in the second direction is overlapped and connected with an orthographic projection of a first IC connection line in the first IC connection line group which is closest to the second IC connection line group on the straight line in the second direction and an orthographic projection of the second IC connection line in the second IC connection line group which is closest to the first IC connection line group on the straight line in the second direction respectively.

For example, in the manufacturing method of the array substrate provided by an embodiment of the present disclosure, the etching process includes a wet etching process.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

Figure 1:
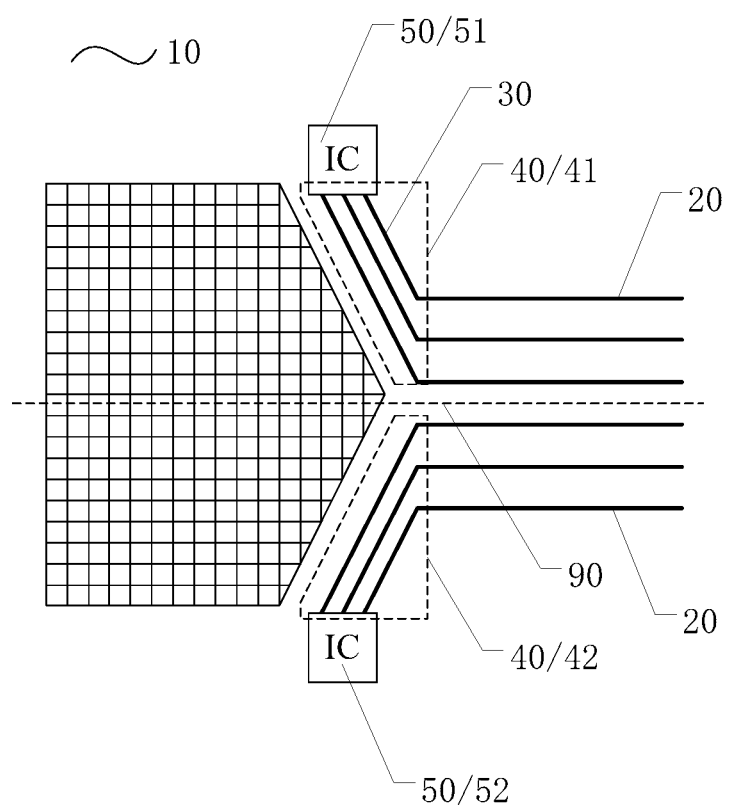
FIG. 1 is a schematic diagram of an array substrate of an organic light emitting diode display device.

In order to make objects, technical details and advantages of the embodiments of the invention apparent, technical solutions according to the embodiments of the present disclosure will be described clearly and completely as below in conjunction with the accompanying drawings of embodiments of the present disclosure. It is to be understood that the described embodiments are only a part of but not all of exemplary embodiments of the present disclosure. Based on the described embodiments of the present disclosure, various other embodiments can be obtained by those of ordinary skill in the art without creative labor and those embodiments shall fall into the protection scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present application, are not intended to indicate any sequence, amount or importance, but for distinguishing various components. Also, the terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not intended to define a physical connection or mechanical connection, but may include an electrical connection/coupling, directly or indirectly.

At present, Organic light emitting diode (OLED) display devices have a high compound growth rate in the market, which is the focus of research and market for display technology. However, compared with liquid crystal display devices, the yield of OLED display device is lower, and the relatively low yield has become one of the main reasons limiting the development of OLED display technology. Moreover, the yield problem of large-sized OLED display devices is particularly prominent.

"Transverse split screen" is a common refractory defect of OLED display devices, and is also one of the major defects affecting the yield of OLED display devices. "Transverse screen separation" refers to the phenomenon that a separation line in the transverse direction on a display screen of the OLED display device can be observed by naked eyes. In the research, the inventor(s) of the present application noticed that the above-mentioned "transverse split screen" defect is relatively rare in liquid crystal display devices. After research and analysis, the inventor(s) of this application believes that because the liquid crystal display devices are voltage-driven display technology and the OLED display devices are a current-driven display technology, the OLED display devices are more sensitive to manufacturing defects of signal lines (e.g., gate lines, data lines, etc.) and electronic devices (e.g., thin film transistors) on an array substrate.

As for the "transverse screen separation" defect, after defect analysis, the inventor(s) of the present application found that the location where the "transverse screen separation" defect occurred is just at a junction of the two IC connection lines of two driving ICs. Hereinafter, FIG. 1 is schematically described as an example. FIG. 1 is a schematic diagram of an array substrate of an OLED display device. FIG. 1 shows a film pattern of the array substrate. As shown in FIG. 1, the array substrate includes a base substrate 10 and a film layer pattern on the base substrate 10; the film pattern includes signal lines 20 located on the base substrate 10 and IC connection lines 30 located on the base substrate 10. IC connection lines 30 are provided in one-to-one correspondence with the signal lines 20 to connect the signal lines 20 to the two driving ICs 50. In this case, the IC connection lines 30 can be divided into a first IC connection line group 41 in which the IC connection lines 30 are connected with the first driving IC 51 and a second IC connection line group 42 in which the IC connection lines 30 are connected with the second driving IC 52. There is an obvious separation line 90 between the two IC connection line groups, namely, the first IC connection line group 41 and the second IC connection line group 42, while the "transverse screen separation" defect usually occurs at the position where the separation line 90 between the first IC connection line group 41 and the second IC connection line group 42 is located. Therefore, the inventor(s) of the present application believes that the separation line 90 has a dividing effect, and film patterns on both sides of the separation line 90 of the first IC connection line group 41 and the second IC connection line group 42 are unevenly distributed, thus causing the separation line 90 to affect the flow of etching liquid, further causing uneven concentration of etching liquid above and below the separation line 90, and causing slight fluctuations in process parameters such as line width, etc. And, the OLED display device is sensitive to the slight fluctuations in process parameters such as line width, resulting in the above-mentioned "transverse screen separation" defect. Therefore, the inventor(s) of the present application thought of redesigning the film pattern on the array substrate to solve the above-mentioned "transverse screen separation" defect.

The embodiments of the present disclosure provide an array substrate, a manufacturing method thereof and a display device. The array substrate comprises a base substrate, a plurality of signal lines and a plurality of IC connection lines arranged on the base substrate. A plurality of IC connection lines and a plurality of signal lines are arranged in one-to-one correspondence; each of the signal lines extends in a first direction, the plurality of IC connection lines including at least two IC connection line groups arranged in a second direction perpendicular to the first direction, the at least two IC connection line groups being configured to connect the plurality of signal lines to at least two driving ICs; the at least two IC connection line groups include a first IC connection line group and a second IC connection line group which are adjacent to each other; the array substrate further includes a lead, and an orthographic projection of the lead on the straight line in the second direction is overlapped or connected with an orthographic projection of a first IC connection line in the first IC connection line group which is closest to the second IC connection line group on the straight line in the second direction and an orthographic projection of a second IC connection line in the second IC connection line group which is closest to the first IC connection line group on the straight line in the second direction, respectively. Therefore, in a patterning process of the array substrate, a photoresist pattern corresponding to the lead can play a role in guiding the etching liquid, thereby alleviating or even eliminating the problem of uneven concentration of the etching liquid above and below the separation line between the first IC connection line group and the second IC connection line group, thereby improving the yield of an OLED display device using the array substrate.

Hereinafter, the array substrate, the manufacturing method thereof and the display device provided by the embodiments of the present disclosure will be described in detail below with reference to the accompanying drawings.

Figure 2A:
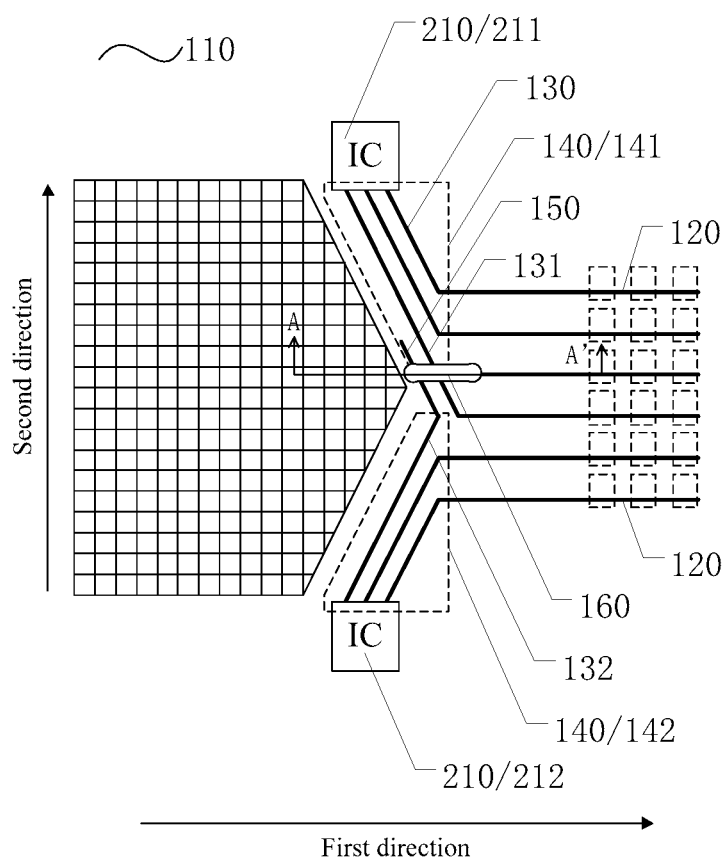
FIG. 2A is a schematic plan view of an array substrate according to an embodiment of the present disclosure.

An embodiment of the present disclosure provides an array substrate. FIG. 2A is a schematic plan view of an array substrate according to an embodiment of the present disclosure. As shown in FIG. 2A, the array substrate includes a base substrate 110 and a plurality of signal lines 120 and a plurality of IC connection lines 130 disposed on the base substrate 110. A plurality of signal lines 120 are parallel to each other on the base substrate 110, for example, the signal lines 120 may be gate lines for driving pixel units (dashed lines in FIG. 2A) on the array substrate 110 for display, for example, as shown in FIG. 2A, one IC connection line 130 is connected with only one signal line 120.

As shown in FIG. 2A, the signal line 120 extends in a first direction, and the plurality of IC connection lines 130 include at least two IC connection line groups 140 arranged in a second direction perpendicular to the first direction, the at least two IC connection line groups 140 being configured to connect the plurality of signal lines 120 to at least two driving ICs; that is, the IC connection lines 130 in each of the IC connection line groups 140 connect the corresponding signal lines 120 to one driving IC, and the IC connection lines 130 in at least two IC connection line groups 140 connect the signal lines 120 to at least two driving ICs. The above-mentioned at least two IC connection line groups 140 include a first IC connection line group 141 and a second IC connection line group 142 which are adjacent to each other, the IC connection lines 130 in the first IC connection line group 141 are connected with a first driving IC 211, and the IC connection lines 130 in the second IC connection line group 142 are connected with a second driving IC 212. The IC connection line 130 in the first IC connection line group 141 which is closest to the second IC connection line 142 is a first IC connection line 131. The IC connection line 130 in the second IC connection line group 142 which is closest to the first IC connection line group 141 is a second IC connection line.

As shown in FIG. 2A, the array substrate further includes a lead 150, and an orthographic projection of the lead 150 on a straight line in the second direction is overlapped or connected with an orthographic projection of the first IC connection line 131 on the straight line in the second direction and an orthographic projection of the second IC connection line 132 on the straight line in the second direction, respectively. That is, the orthographic projection of the lead 150 on the straight line in the second direction is overlapped or connected with the orthographic projection of the first IC connection line 131 on the straight line in the second direction, and the orthographic projection of the lead 150 on the straight line in the second direction is overlapped or connected with the orthographic projection of the second IC connection line 132 on the straight line in the second direction. The above-mentioned "connected" refers to that endpoints of the orthographic projections on the straight line in the second direction coincide, but the orthographic projections are not overlapped with each other. In this case, the lead 150 must span the first IC connection line group 141 and the second connection line group 142 which are adjacent to each other in the second direction.

In a manufacturing process of the array substrate provided by the present embodiment, in the etching process for forming the above-mentioned signal lines 120, IC connection lines 130 and lead 150, because the photoresist pattern is used to form a film pattern where the signal lines 120, IC connection lines 130 and lead 150 are located, a pattern shape of the photoresist pattern is the same as a pattern shape of the film pattern where the signal line 120, IC connection line 130 and lead 150 are located. Upon an etching process being performed, a portion of the photoresist pattern corresponding to the lead 150 can play a role in guiding the etching liquid to flow from the first IC connection line group 141 to the second connection line group 142 or from the second IC connection line group 142 to the first connection line group 141, thus reducing or even eliminating the problem of uneven concentration of etching liquid above and below the a separation line between the first IC connection line group and the second IC connection line group in the existing designs, avoiding the problem of slight fluctuation of process parameters such as line width caused by uneven etching liquid at edges of the pattern, improving the uniformity of process parameters such as line width, and further avoiding undesirable phenomena such as "transverse screen separation". Therefore, the array substrate can also improve the yield of an OLED display device using the array substrate.

It should be noted that the array substrate shown in FIG. 2A only shows one film pattern, and the array substrate may also include other film patterns, other film patterns may refer to the existing designs, and embodiments of the present disclosure are not limited herein.

It should be noted that, in order to clearly show the connection relationship of IC connection lines, FIG. 2A shows the drive IC 210, but the array substrate is usually not provided with the drive IC, but is connected with an external drive IC through a Flexible Printed Circuit (FPC). Of course, the embodiments of the present disclosure include but are not limited thereto, and the driving IC may be integrated on the array substrate.

Figure 2B:
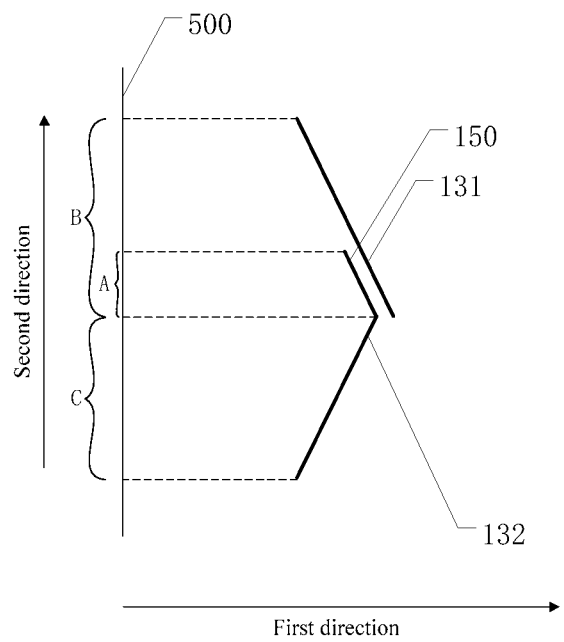
FIG. 2B is a schematic diagram of the positional relationship among a lead, a first IC connection line and a second IC connection line on an array substrate according to an embodiment of the present disclosure.

In order to clearly explain the specific case where the orthogonal projection of the lead on the straight line in the second direction is overlapped or connected with the orthogonal projection of the first IC connection line on the straight line in the second direction and the orthogonal projection of the second IC connection line on the straight line in the second direction respectively, as described above, FIG. 2B shows a schematic diagram of the positional relationship of the lead, the first IC connection line and the second IC connection line on the array substrate according to an embodiment of the present disclosure, as shown in FIG. 2B, the orthographic projection A of the lead 150 on the straight line 500 in the second direction and the orthographic projection B of the first IC connection line 131 on the straight line 500 in the second direction is overlapped with each other, and the orthographic projection A of the lead 150 on the straight line 500 in the second direction is connected with the orthographic projection C of the second IC connection line 132 on the straight line 500 in the second direction.

For example, as shown in FIG. 2A, the signal line 120, the IC connection line 130, and the lead 150 are disposed on the same layer, that is, the signal line 120, the IC connection line 130, and the lead 150 may be formed by the same conductive layer through the same patterning process.

For example, the patterning process described above may include forming photoresist on a side of a conductive layer (e.g., a metal film layer) away from the base substrate; exposing and developing the photoresist by using a mask plate to form a photoresist pattern; and etching the conductive layer by using the photoresist pattern as a mask to form the above-mentioned signal lines, IC connection lines and lead.

For example, in some examples, a plurality of signal lines are insulated from each other and configured to load different signals respectively.

For example, the signal lines 120 may be gate lines. In this case, the signal lines 120, the IC connection lines 130, and the lead 150 may be formed by the same patterning process through a gate metal layer.

For example, in some examples, as shown in FIG. 2A, the lead 150 is connected with the second IC connection line 132, and at this time, the orthographic projection of the lead 150 on the straight line in the second direction is connected with the orthographic projection of the second IC connection line 132 on the straight line in the second direction. Moreover, an arrangement order of the signal line 120 corresponding to the first IC connection lines 131 and the signal line 120 corresponding to the second IC connection lines 132 in the second direction is opposite to an arrangement order of the first IC connection line group 141 and the second IC connection line group 142 in the second direction. That is, as shown in FIG. 2A, the first IC connection line 131 and the second IC connection line group 142 are partially in a cross arrangement.

In this case, on the one hand, the lead 150 can guide the etching liquid to flow from the first IC connection line group 141 to the second connection line group 142 or from the second IC connection line group 142 to the first connection line group 141, which can reduce or even eliminate the problem of uneven concentration of etching liquid above and below the separation line between the first IC connection line group and the second IC connection line group in the existing designs, and avoid the problem of slight fluctuation of process parameters such as line width caused by uneven etching liquid at edges of the pattern. On the other hand, the first IC connection line group 141 and the second IC connection line group 142 which are adjacent to each other no longer have an obvious separation line due to the above-mentioned cross arrangement, so that the problem of uneven concentration of etching liquid above and below the separation line between the first IC connection line group and the second IC connection line group in the existing design can be further alleviated or even eliminated, and the problem of slight fluctuation of process parameters such as line width caused by uneven etching liquid can be further avoided.

For example, in some examples, as shown in FIG. 2A, because the IC connection lines 130 in the second IC connection line group 142 need to connect the corresponding signal lines 120 to the second driving IC 212 corresponding to the second IC connection line group 142, and the orthographic projection of the lead 150 on the straight line in the second direction is overlapped or connected with the orthographic projection of the first IC connection line 131 on the straight line in the second direction, the lead 150 can be electrically connected with the signal line 120 corresponding to the second IC connection line 132 through a bridge structure 160.

For example, the bridge structure 160 may include two via holes in an insulating layer (e.g., a gate insulating layer) on a film layer where the signal lines 120 and the IC connection lines 130 are located and a conductive structure filled in the two via holes and connecting the two via holes.

For example, the conductive structure may be formed by subsequently forming an indium tin oxide (ITO) film layer.

For example, in some examples, as shown in FIG. 2A, the lead 150 is disposed in parallel with the first IC connection line 131 and is located on a side of the first IC connection line 131 away from the signal lines 120. As a result, the lead 150 does not need to be disposed between the two IC connection lines 130, which can prevent short-circuit between the two IC connection lines 130 and ensure uniform gaps between the IC connection lines. It should be noted that, in the etching process, the more uniform the film pattern, the more uniform the flow of etching liquid, and the more uniform the concentration of etching liquid in different areas on the array substrate, thus the more uniform the process parameters such as the line width of the formed film pattern.

Figure 3:
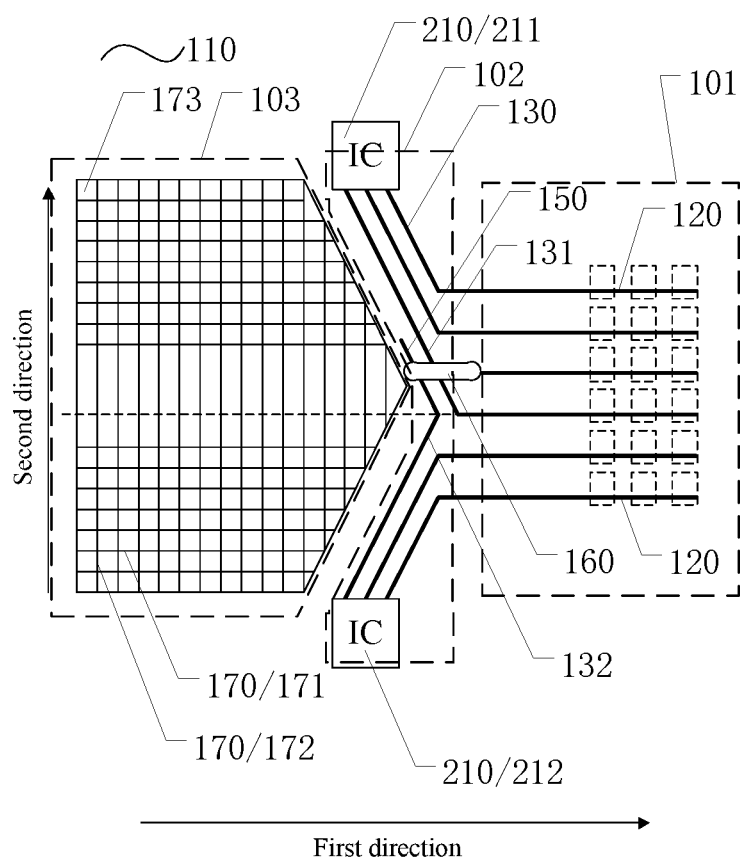
FIG. 3 is a schematic plan view of another array substrate according to an embodiment of the present disclosure.

FIG. 3 is a schematic plan view of another array substrate according to an embodiment of the present disclosure. As shown in FIG. 3, the array substrate includes a display area 101, a peripheral area 102 surrounding the display area 101, and a dummy area 103 located on a side of the peripheral area 102 away from the display area 101. The display area 101 may include the above-mentioned pixel units for display; a plurality of signal lines 120 are located in the display area 101 and the peripheral area 102, and a plurality of IC connection lines 130 are located in the peripheral area 102. The dummy area 103 is provided with a mesh structure 170 including transverse grid lines 171 extending in a first direction and longitudinal grid lines 172 extending in a second direction to form a plurality of openings 173 arranged in an array. A size of the openings 173 crossed by an extension line (a dummy line) of the signal line 120 corresponding to the first IC connection line 131 in the second direction is larger than a size of the gaps between adjacent ones of the plurality of signal lines 120 in the second direction. In other words, a portion of the mesh structure 170 corresponding to the first IC connection line and the second IC connection line cancels the transverse grid lines 171, thereby reducing the blocking effect of the transverse grid lines 171 on etching liquid, further reducing or even eliminating the problem of uneven concentration of etching liquid above and below the separation line between the first IC connection line group and the second IC connection line group in the existing designs, and the problem of slight fluctuation of process parameters such as line width caused by uneven etching liquid. It should be noted that the above-mentioned mesh structure 170 can be disposed on the same layer as the signal lines 120 and the IC connection lines 130, that is, the above-mentioned mesh structure 170 can be formed on the same film layer as the signal lines 120 and the IC connection lines 130 through the same patterning process. It should be noted that in order to clearly show the display area 101, the peripheral area 102 and the dummy area 103, the IC connection line groups 140, 141 and 142 are not marked in FIG. 3, and the specific positions of the IC connection line groups can be seen in FIG. 2A.

For example, as shown in FIG. 3, the opening 173 through which the extension line of the signal line 120 corresponding to the first IC connection line 131 passes is the same as the opening 173 through which an extension line of the signal line 120 corresponding to the second IC connection line 132 passes, thus ensuring that the opening 173 can reduce or even eliminate the problem of uneven concentration of etching liquid above and below the separation line between the first IC connection line group and the second IC connection line group and the problem of slight fluctuation of process parameters such as line width caused by uneven etching liquid in the existing designs.

For example, in some examples, as shown in FIG. 3, the size of the opening 173 crossed by the extension line of the signal line 120 corresponding to the first IC connection line 131 in the second direction is greater than twice of the size of the gap between two adjacent ones of the signal lines 120 in the second direction, thereby enhancing the guiding effect of the opening 173 on etching liquid. In the embodiments of the present disclosure, the size of the opening 173 crossed by the extension line of the signal line 120 corresponding to the first IC connection line 131 in the second direction can be adjusted according to the actual product to achieve the best effect.

For example, in some examples, the signal lines 120 includes gate lines, in this case, the at least two IC connection line groups 140 are configured to connect the gate lines to at least two gate driving ICs, that is, the driving IC may be a gate driving IC.

It should be noted that in the array substrate shown in FIG. 2A and FIG. 3, the lead 150 is both connected with the second IC connection line 132. However, the embodiments of the present disclosure include but are not limited to this, and the conductive lead 150 may be insulated from the IC connection leads 130 as long as the orthographic projection of the lead 150 on the straight line in the second direction and the orthographic projection of the first IC connection lead 131 on the straight line in the second direction and the orthographic projection of the second IC connection lead 132 on the straight line in the second direction are overlapped or connected with each other, respectively, thereby guiding the flow of etching liquid.

Figure 4:
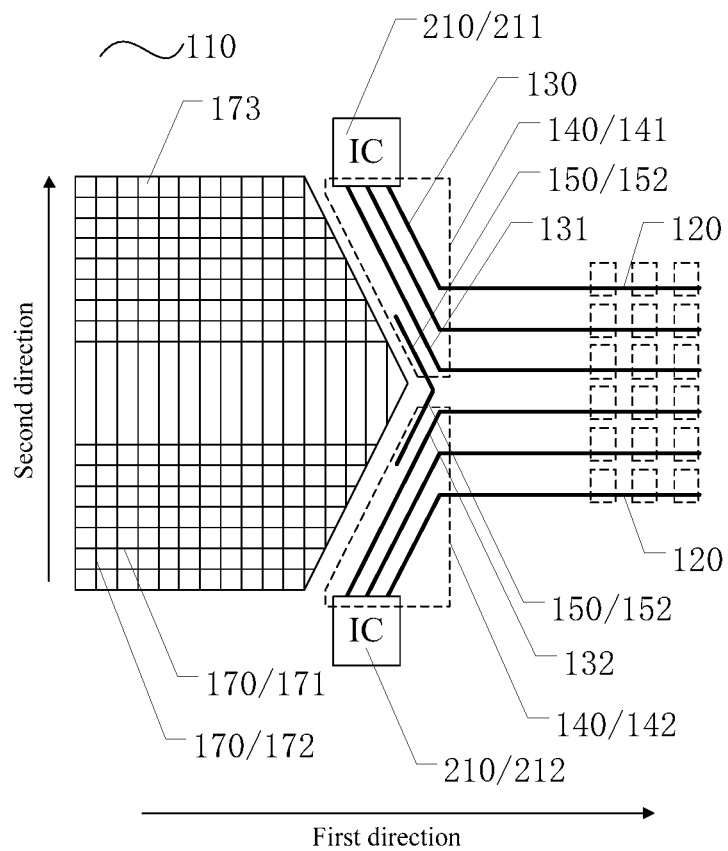
FIG. 4 is a schematic plan view of another array substrate according to an embodiment of the present disclosure.

FIG. 4 is a schematic plan view of another array substrate according to an embodiment of the present disclosure. As shown in FIG. 4, the array substrate includes a base substrate 110, a plurality of signal lines 120 and a plurality of IC connection lines 130 disposed on the base substrate 110. The plurality of signal lines 120 are parallel to each other on the substrate 110. A plurality of IC connection lines 130 are disposed in one-to-one correspondence with the plurality of signal lines 120 extending in a first direction, the plurality of IC connection lines 130 include at least two IC connection line groups 140 arranged in a second direction perpendicular to the first direction, and the at least two IC connection line groups 140 are configured to connect the plurality of signal lines 120 to at least two driving ICs. The above-mentioned at least two IC connection line groups 140 include a first IC connection line groups 141 and a second IC connection line groups 142 which are adjacent to each other. The IC connection line 130 in the first IC connection line group 140 which is closest to the second IC connection line 142 is a first IC connection line 131. The IC connection line 130 in the second IC connection line group 142 which is closest to the first IC connection line group 141 is a second IC connection line. The array substrate further includes a lead 150, and an orthographic projection of the lead 150 on the straight line in the second direction is overlapped with an orthographic projection of the first IC connection line 131 on the straight line in the second direction and an orthographic projection of the second IC connection line 132 on the straight line in the second direction, respectively. That is, the orthographic projection of the lead 150 on the straight line in the second direction is simultaneously overlapped with the orthographic projection of the first IC connection line 131 on the straight line in the second direction and the orthographic projection of the second IC connection line 132 on the straight line in the second direction.

In the manufacturing process of the array substrate provided by the present embodiment, in the etching process of forming the above-mentioned signal lines 120, IC connection lines 130 and lead 150, a photoresist pattern corresponding to the lead 150 can play a role in guiding the etching liquid to flow from the first IC connection line group 141 to the second connection line group 142 or from the second IC connection line group 142 to the first connection line group 141, so as to reduce or even eliminate the problem of uneven concentration of etching liquid above and below the separation line between the first IC connection line group and the second IC connection line group in the existing designs and the problem of slight fluctuation of process parameters such as line width and the like caused by uneven etching liquid, thereby improving the uniformity of process parameters such as line width and the like and further avoiding defects such as "transverse screen separation". Therefore, the array substrate can also improve the yield of the OLED display device using the array substrate.

For example, in some examples, as shown in FIG. 4, the lead 150 is insulated from the plurality of signal lines 120 and the plurality of IC connection lines 130. In other words, the lead 150 is not connected with the signal lines 120 and the IC connection lines 130. In this case, the lead 150 is a dummy lead, which only serves to guide the etching liquid to flow from the first IC connection line group 141 to the second connection line group 142 or from the second IC connection line group 142 to the first connection line group 141, and does not transmit signals or currents.

For example, in some examples, as shown in FIG. 4, the lead 150 includes a first portion 151 parallel to the first IC connection line 131 and a second portion 152 parallel to the second IC connection line 132, thus ensuring that the added lead 151 does not reduce the uniformity of the film layer where the signal line 120 and the IC connection line 130 are located. In the etching process, the more uniform the film pattern, the more uniform the flow of etching liquid, and the more uniform the concentration of etching liquid in different areas on the array substrate, thus the more uniform the process parameters such as line width and the like of the formed film pattern. Therefore, the lead 150 provided in this example can improve the uniformity of process parameters such as line width and the like.

Figure 5:
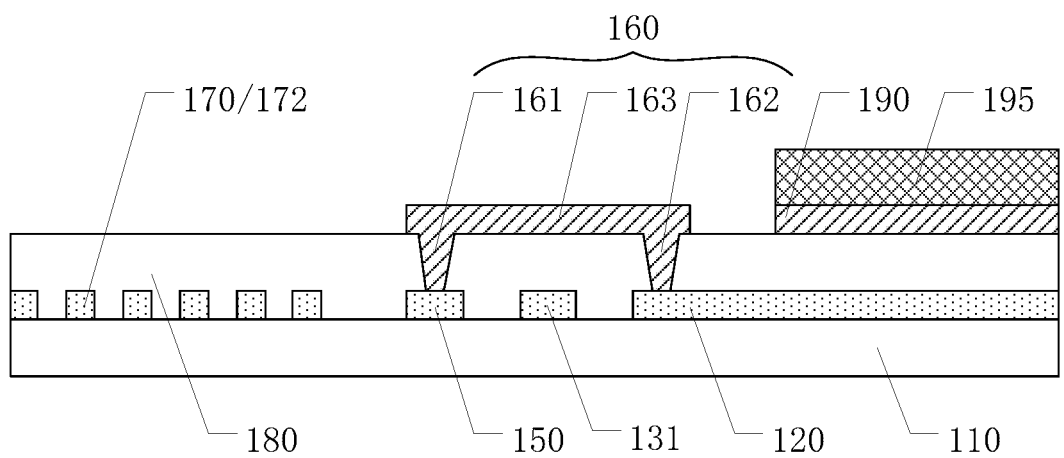
FIG. 5 is a schematic cross-sectional view of an array substrate along AA' in FIG. 2A according to an embodiment of the present disclosure.

FIG. 5 is a schematic cross-sectional view of an array substrate along AA' in FIG. 2A according to an embodiment of the present disclosure. As shown in FIG. 5, FIG. 5 shows a bridging structure 160, which may include two via holes 161 and 162 in an insulating layer 180 on the film layer where the signal line 120 and the IC connection line 130 are located, and a conductive structure 163 filled in the two via holes and connecting the two via holes, thereby connecting the lead 150 to the signal line 120.

For example, in some examples, upon the signal lines 120 includes gate lines, as shown in FIG. 5, the array substrate further includes an anode 190 located on a side of the gate line 120 away from the base substrate 110 and an organic light emitting layer 195 located on a side of the anode 190 away from the base substrate 110 and electrically connected with the anode 190. The organic light emitting layer 195 can emit light under the drive of the anode 190. In this case, the array substrate can be an array substrate of an OLED display.

It should be noted that FIG. 5 only shows some film layers of the array substrate, the array substrate may also include other film layer patterns, other film layer patterns may refer to conventional designs, and embodiments of the present disclosure are not limited herein.

An embodiment of the present disclosure also provides a display device including the array substrate described in any of the above embodiments. In the manufacturing process of the array substrate and in the etching process for forming the signal lines, the IC connection lines and the lead, a portion of the photoresist pattern corresponding to the lead can play a role in guiding the etching liquid to flow from the first IC connection line group to the second connection line group or from the second IC connection line group to the first connection line group, thereby reducing or even eliminating the problem of uneven concentration of etching liquid above and below the separation line between the first IC connection line group and the second IC connection line group in the existing designs, and the slight fluctuation of process parameters such as line width caused by uneven etching liquid at edges of the pattern, so as to improve the uniformity of process parameters such as line width and further avoid defects such as "transverse screen separation". Therefore, because the display device provided in the present embodiment adopts the above array substrate, the display device can avoid the occurrence of defects such as "transverse screen separation", thus having higher display quality, and in addition, the product yield of the display device is also improved. In addition, because the probability of occurrence of defects such as "transverse screen separation" and the like in a large-size display device is high, the display device provided by the present embodiment can have a larger size while having a higher display quality and a higher yield. For example, the size of the display device may be greater than 48 inches.

For example, the display device may be an organic light emitting diode display device.

Figure 6:
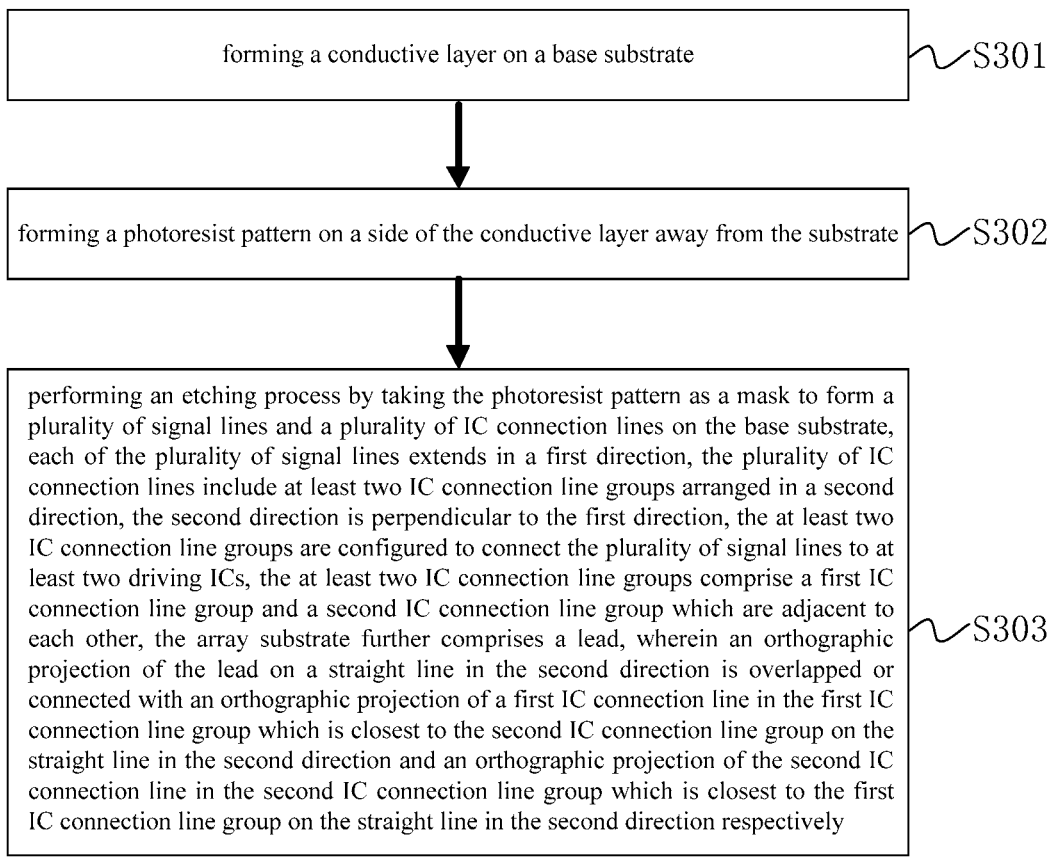
FIG. 6 is a flowchart of a manufacturing method of an array substrate according to an embodiment of the present disclosure.

For example, the display device can be any display device with display function such as television, mobile phone, computer, notebook computer, tablet computer, navigator, electronic photo album, etc. The array substrate can also improve the yield of OLED display using the array substrate An embodiment of the present disclosure also provides a manufacturing method of the array substrate. FIG. 6 is a flowchart of a manufacturing method of an array substrate according to an embodiment of the present disclosure. As shown in FIG. 6, the manufacturing method includes the following steps S301-S302.

Step S301: forming a conductive layer on a base substrate;

For example, the base substrate may be a glass substrate, a quartz substrate, a plastic substrate, or the like. The conductive layer can be made of copper, silver, molybdenum, gold and other metal materials.

Step S302: forming a photoresist pattern on a side of the conductive layer away from the base substrate.

For example, forming a photoresist pattern on the side of the conductive layer away from the base substrate may include coating photoresist on a side of the conductive layer away from the base substrate, and then exposing and developing the coated photoresist by using a mask plate to form the photoresist pattern described above.

Step S303: performing an etching process using the photoresist pattern as a mask to form a plurality of signal lines and a plurality of IC connection lines on the base substrate, each signal line extends in a first direction; the plurality of IC connection lines are arranged in one-to-one correspondence with the plurality of signal lines, the plurality of IC connection lines comprise at least two IC connection line groups arranged along a second direction perpendicular to the first direction, are configured to connect the plurality of signal lines to at least two driving ICs, the at least two IC connection line groups include a first IC connection line group and a second IC connection line group which are adjacent to each other, the array substrate further includes a lead, an orthographic projection of the lead on the straight line in the second direction is overlapped or connected with an orthographic projection of a first IC connection line in the first IC connection line group which is closest to the second IC connection line group on the straight line in the second direction and an orthographic projection of a second IC connection line in the second IC connection line group which is closest to the first IC connection line group on the straight line in the second direction, respectively.

In the manufacturing method of the array substrate provided by the present embodiment, because the photoresist pattern is used as a mask for forming the plurality of signal lines and the plurality of IC connection lines, a pattern shape of the photoresist pattern is the same as a pattern of the film layer where the plurality of signal lines and the plurality of IC connection lines are located. In the etching process for forming the above-mentioned signal lines, IC connection lines and lead, a portion of the photoresist pattern corresponding to the lead can play a role in guiding the etching liquid to flow from the first IC connection line group to the second connection line group or from the second IC connection line group to the first connection line group, thus reducing or even eliminating the problem of uneven concentration of etching liquid above and below the separation line between the first IC connection line group and the second IC connection line group in the existing design, and the problem of slight fluctuation of process parameters such as line width caused by uneven etching liquid at edges of the pattern, thus improving the uniformity of process parameters such as line width, and further avoiding defects such as "transverse screen separation". Therefore, the manufacturing method of the array substrate can also improve the product yield.

For example, in some examples, the etching process described above includes a wet etching process.

For example, in some examples, the manufacturing method of the above array substrate further includes forming an insulating layer on a side of the film layer on which the plurality of signal lines and the plurality of IC connection lines are located away from the base substrate; patterning the insulating layer to form via holes corresponding to lead and via holes corresponding to signal lines corresponding to second IC connection lines in the insulating layer; forming a conductive layer on a side of the insulating layer away from the substrate; patterning the conductive layer to form a conductive structure of two via holes extending into the insulating layer to form a bridge structure and an anode. The lead can be electrically connected with the signal line corresponding to the second IC connection line through the bridging structure.

The following statements should be noted:

(1) The drawings accompanying the embodiment(s) of the present disclosure involve only the structure(s) in connection with the embodiment(s) of the present disclosure, and other structure(s) can be referred to common design(s).

(2) In case of no conflict, features in an embodiment or in different embodiments of the present disclosure can be combined with each other.

The above are merely specific implementations of the present disclosure without limiting the protection scope of the present disclosure thereto. Within the technical scope revealed in the present disclosure, modification(s) or substitution(s) may be easily conceivable for those skilled who are familiar with the present technical field, and these modification(s) and substitution(s) all should be contained in the protection scope of the present disclosure. Therefore the protection scope of the present disclosure should be based on the protection scope of the appended claims.

What is claimed is:

1. An array substrate, comprising:
    a base substrate;
    a plurality of signal lines on the base substrate; and
    a plurality of IC connection lines which are arranged in one-to-one correspondence with the plurality of signal lines,
    wherein each of the plurality of signal lines extends in a first direction, the plurality of IC connection lines include at least two IC connection line groups arranged in a second direction, the second direction is perpendicular to the first direction, the at least two IC connection line groups are configured to connect the plurality of signal lines to at least two driving ICs,
    the at least two IC connection line groups comprise a first IC connection line group and a second IC connection line group which are adjacent to each other, the array substrate further comprises a lead, wherein an orthographic projection of the lead on a straight line in the second direction is overlapped or connected with an orthographic projection of a first IC connection line in the first IC connection line group which is closest to the second IC connection line group on the straight line in the second direction and an orthographic projection of a second IC connection line in the second IC connection line group which is closest to the first IC connection line group on the straight line in the second direction respectively.

2. The array substrate according to claim 1, wherein the lead is connected with the second IC connection line, and an arrangement order of the signal line corresponding to the first IC connection line and the signal line corresponding to the second IC connection line in the second direction is opposite to an arrangement order of the first IC connection line group and the second IC connection line group in the second direction.

3. The array substrate according to claim 2, wherein the lead is electrically connected with the signal line corresponding to the second IC connection line through a bridge structure.

4. The array substrate according to claim 3, wherein the lead is arranged in parallel with the first IC connection line and located on a side of the first IC connection lines away from the plurality of signal lines.

5. The array substrate according to claim 4, further comprising:
    a display area and a peripheral area surrounding the display area; and
    a dummy area located on a side of the peripheral area away from the display area,
    wherein the plurality of signal lines are located in the display area and the peripheral area, the plurality of IC connection lines are located in the peripheral area, and the dummy area is provided with a mesh structure,
    the mesh structure comprises transverse grid lines extending in the first direction and longitudinal grid lines extending in the second direction to form a plurality of openings arranged in an array, and a size of each of the openings crossed by an extension line of a signal line corresponding to the first IC connection line in the second direction is larger than a size of a gap between adjacent ones of the plurality of signal lines in the second direction.

6. The array substrate according to claim 5, wherein the size of each of the openings crossed by the extension line of the signal line corresponding to the first IC connection line in the second direction is greater than twice of the size of the gap between adjacent ones of the plurality of signal lines in the second direction.

7. The array substrate according to claim 2, wherein the lead is arranged in parallel with the first IC connection line and located on a side of the first IC connection line away from the plurality of signal lines.

8. The array substrate according to claim 1, wherein the lead is arranged in parallel with the first IC connection line and located on a side of the first IC connection line away from the plurality of signal lines.

9. The array substrate according to claim 1, wherein the lead is insulated from the plurality of signal lines and the plurality of IC connection lines.

10. The array substrate according to claim 9, wherein the lead comprises a first portion parallel to the first IC connection line and a second portion parallel to the second IC connection line.

11. The array substrate according to claim 1, further comprising:
    a display area and a peripheral area surrounding the display area; and
    a dummy area located on a side of the peripheral area away from the display area,
    wherein the plurality of signal lines are located in the display area and the peripheral area, the plurality of IC connection lines are located in the peripheral area, and the dummy area is provided with a mesh structure, the mesh structure comprises transverse grid lines extending in the first direction and longitudinal grid lines extending in the second direction to form a plurality of openings arranged in an array, and a size of each of the openings crossed by an extension line of a signal line corresponding to the first IC connection line in the second direction is larger than a size of a gap between adjacent ones of the plurality of signal lines in the second direction.

12. The array substrate according to claim 11, wherein the size of each of the openings crossed by the extension line of the signal line corresponding to the first IC connection line in the second direction is greater than twice of the size of the gap between adjacent ones of the plurality of signal lines in the second direction.

13. The array substrate according to claim 1, wherein the plurality of signal lines include gate lines, and the at least two IC connection line groups are configured to connect the gate lines to at least two gate driving ICs.

14. The array substrate according to claim 13, further comprising:
    an anode located on a side of the gate lines away from the base substrate; and
    an organic light emitting layer located on a side of the anode away from the base substrate and electrically connected with the anode.

15. The array substrate according to claim 1, wherein the plurality of signal lines are insulated from each other.

16. A display device, comprising the array substrate according to claim 1.

17. A manufacturing method of an array substrate, comprising:
    forming a conductive layer on a base substrate;
    forming a photoresist pattern on a side of the conductive layer away from the substrate; and
    performing an etching process by taking the photoresist pattern as a mask to form a plurality of signal lines and a plurality of IC connection lines on the base substrate,
    wherein each of the plurality of signal lines extends in a first direction, the plurality of IC connection lines include at least two IC connection line groups arranged in a second direction, the second direction is perpendicular to the first direction, the at least two IC connection line groups are configured to connect the plurality of signal lines to at least two driving ICs,
    the at least two IC connection line groups comprise a first IC connection line group and a second IC connection line group which are adjacent to each other, the array substrate further comprises a lead, wherein an orthographic projection of the lead on a straight line in the second direction is overlapped or connected with an orthographic projection of a first IC connection line in the first IC connection line group which is closest to the second IC connection line group on the straight line in the second direction and an orthographic projection of a second IC connection line in the second IC connection line group which is closest to the first IC connection line group on the straight line in the second direction respectively.

18. The manufacturing method of the array substrate according to claim 17, wherein the etching process comprises a wet etching process.

* * * * *